(12) United States Patent
Odell

(10) Patent No.: US 11,942,900 B2
(45) Date of Patent: Mar. 26, 2024

(54) SIGNAL COMPENSATION WITH SUMMED ERROR SIGNALS

(71) Applicant: POWER INTEGRATIONS, INC., San Jose, CA (US)

(72) Inventor: Arthur B. Odell, Morgan Hill, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 98 days.

(21) Appl. No.: 17/501,877

(22) Filed: Oct. 14, 2021

(65) Prior Publication Data

US 2023/0122632 A1    Apr. 20, 2023

(51) Int. Cl.
*H03F 3/45* (2006.01)
*H03F 1/02* (2006.01)
*H03F 1/32* (2006.01)

(52) U.S. Cl.
CPC ......... *H03F 1/0288* (2013.01); *H03F 1/3229* (2013.01); *H03F 1/3288* (2013.01); *H03F 3/45636* (2013.01)

(58) Field of Classification Search
CPC .... H03F 1/0288; H03F 1/3229; H03F 1/3288; H03F 3/45636
See application file for complete search history.

(56) References Cited

U.S. PATENT DOCUMENTS

| | | | |
|---|---|---|---|
| 6,034,568 A * | 3/2000 | Bonaccio | H03F 1/483 330/253 |
| 6,882,212 B2 | 4/2005 | Balakrishnan | |
| 7,034,625 B2 | 4/2006 | Pham | |
| 7,078,971 B2 | 7/2006 | Colbeck | |
| 7,215,107 B2 | 5/2007 | Djenguerian et al. | |

(Continued)

FOREIGN PATENT DOCUMENTS

WO    2016077226 A1    5/2016

OTHER PUBLICATIONS

H. Dean Venable, "The K Factor: A New Mathematical Tool for Stability Analysis and Synthesis," Powercon 10, Mar. 1983, <https://www.venableinstruments.com/venable-vault> retrieved Mar. 15, 2022, 12 pages.

(Continued)

*Primary Examiner* — Khanh V Nguyen
(74) *Attorney, Agent, or Firm* — Christensen O'Connor Johnson Kindness PLLC

(57) ABSTRACT

A compensated amplifier for use in a power converter controller. The compensated amplifier comprises a first amplifier, a second amplifier, an integrator, and an arithmetic operator. The first amplifier coupled to receive a sensed signal and a reference signal and configured to generate a first error signal in response to the sensed signal and the reference signal. The second amplifier coupled to the first amplifier and configured to generate a second error signal in response to the sensed signal and the reference signal. The integrator coupled to the first amplifier and configured to generate an integrated error signal in response to the first error signal. The arithmetic operator coupled to the integrator and to the second amplifier, wherein the arithmetic operator is configured to generate a control signal in response to the integrated error signal and the second error signal.

21 Claims, 5 Drawing Sheets

(56) References Cited

U.S. PATENT DOCUMENTS

| | | |
|---|---|---|
| 7,359,222 B2 | 4/2008 | Mayell et al. |
| 7,365,559 B2 | 4/2008 | Colbeck |
| 7,443,153 B2 | 10/2008 | Mayell |
| 7,535,735 B2 | 5/2009 | Cuadra et al. |
| 7,564,229 B2 | 7/2009 | Odell |
| 7,592,844 B2 | 9/2009 | Colbeck |
| 7,675,761 B2 | 3/2010 | Cuadra et al. |
| 7,746,050 B2 | 6/2010 | Djenguerian et al. |
| 7,759,914 B2 | 7/2010 | Odell et al. |
| 7,876,583 B2 | 1/2011 | Polivka et al. |
| 7,893,754 B1 | 2/2011 | Kung et al. |
| 7,936,159 B2 | 5/2011 | Park et al. |
| 8,004,262 B2 | 8/2011 | Saint-Pierre |
| 8,022,744 B2 | 9/2011 | Lalithambika et al. |
| 8,035,254 B2 | 10/2011 | Djenguerian et al. |
| 8,098,503 B2 | 1/2012 | Gaknoki et al. |
| 8,154,321 B2 | 4/2012 | Polivka |
| 8,305,063 B2 | 11/2012 | Wang et al. |
| 8,368,370 B2 | 2/2013 | Morrish |
| 8,525,494 B2 | 9/2013 | Wang et al. |
| 8,750,002 B2 | 6/2014 | Duvnjak |
| 8,970,302 B2 | 3/2015 | Schulz |
| 9,071,146 B2 | 6/2015 | Matthews et al. |
| 9,093,906 B2 | 7/2015 | Zhang et al. |
| 9,093,916 B2 | 7/2015 | Baurle |
| 9,112,425 B2 | 8/2015 | Prescott et al. |
| 9,164,133 B2 | 10/2015 | Polivka |
| 9,166,575 B2 | 10/2015 | Balakrishnan et al. |
| 9,276,479 B2 | 3/2016 | Djenguerian et al. |
| 9,287,784 B2 | 3/2016 | Zhang et al. |
| 9,343,953 B2 | 5/2016 | Colbeck |
| 9,450,478 B1 * | 9/2016 | Djenguerian ........... H02M 3/24 |
| 9,584,017 B1 | 2/2017 | Sundararaj et al. |
| 9,780,666 B2 | 10/2017 | Odell et al. |
| 9,780,838 B2 | 10/2017 | Peter et al. |
| 9,804,205 B2 | 10/2017 | Duvjnak et al. |
| 9,983,239 B2 | 5/2018 | Mayell |
| 10,027,236 B1 | 7/2018 | Gaknoki et al. |
| 10,218,282 B1 | 2/2019 | Moore et al. |
| 10,355,583 B1 | 7/2019 | Moore et al. |
| 10,389,226 B1 | 8/2019 | Pastore et al. |
| 10,498,300 B2 | 12/2019 | Schulz |
| 10,811,956 B2 | 10/2020 | Moore et al. |
| 10,819,102 B2 | 10/2020 | Mayell |
| 10,826,375 B2 | 11/2020 | Wang et al. |
| 11,095,263 B2 | 8/2021 | Wong et al. |
| 11,196,347 B2 | 12/2021 | Colbeck et al. |
| 2003/0174023 A1 * | 9/2003 | Miyasita ............. H03F 3/45085 330/254 |
| 2006/0285406 A1 * | 12/2006 | Pan ...................... G11C 7/1078 365/207 |
| 2013/0083579 A1 | 4/2013 | Gaknoki et al. |

OTHER PUBLICATIONS

SW Lee, "Demystifying Type II and Type III Compensators Using Op-Amp and OTA for DC/DC Converters," (SLVA662)—Texas Instruments, Jul. 2014, pp. 1-16.

Tahar Allag and Nick Tseng, "Understanding Compensation Network for the TPS54120," (SLVA503A)—Texas Instruments, Feb. 2011, pp. 1-6.

Tahar Allag et al., "Understanding Compensation Network for the TPS54120", Application Report, SLVA503A, Feb. 2011—Revised May 2012, pp. 1-6, Texas Instruments Incorporated, Dallas Texas.

SW Lee, "Demystifying Type II and Type III Compensators Using Op-Amp and OTA for DC/DC Converters", Application Report, SLVA662, Jul. 2014, pp. 1-16, Texas Instruments Incorporated, Dallas Texas.

* cited by examiner

SIGNAL COMPENSATION WITH SUMMED ERROR SIGNALS

BACKGROUND INFORMATION

Field of the Disclosure

The present invention relates generally to signal compensation, and more specifically to amplifiers with signal compensation.

Background

Amplifiers may be used in many of today's electronics. In one example, amplifiers may be used in closed loop control systems in which a quantity is sensed and regulated to a reference value. One example of this closed loop control may be in switched mode power converter in which a high voltage alternating current (ac) input is converted to provide a well-regulated direct current (dc) output through an energy transfer element. The switched mode power converter generally includes a controller which provides output regulation by sensing one or more signals representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

At its input, an amplifier such as an operational amplifier, may receive the sensed signal representative of the output quantity and the reference (or target) value for the output quantity and output a control signal representative of the difference between the sensed output quantity and the reference. The control signal may then be utilized by the controller to control switching of the switch.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
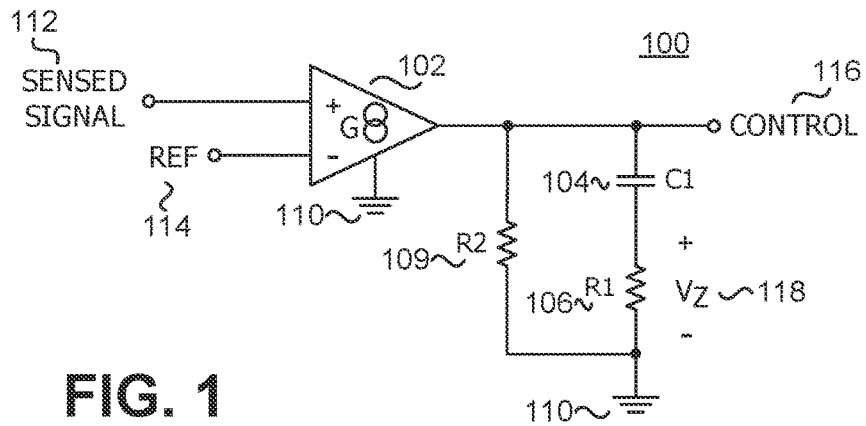
FIG. 1 illustrates an example amplifier with compensation which receives a sense signal and reference and outputs a control signal.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure, or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

An amplifier is an electronic circuit which provides an output which is a scaled version of its input. There may be more than one input to the amplifier and the inputs may be added or subtracted by different scaling factors to produce the output. An amplifier which subtracts one input from another is typically referred to as a differential amplifier. An amplifier which adds one input to another may be referred to as a summing amplifier. The inputs may be voltages or currents and the output may be a voltage or a current. A voltage input may produce a current output and a current input may produce a voltage output.

An operational amplifier produces a voltage output from voltage inputs, whereas a transconductance amplifier produces a current output from voltage inputs. The scaling factor is typically referred to as the gain. An amplifier that has a voltage output from a voltage input has a dimensionless gain, whereas a transconductance amplifier has a gain with the units of transconductance (e.g., current divided by voltage).

Amplifiers may be utilized in closed loop control systems, such as switched mode power converters. The amplifier may receive a sensed signal and a reference (or target) at its inputs and outputs an error signal representative of the difference between the sensed signal and the reference magnified by some gain. For closed loop control systems, the error signal is further processed to provide a control signal which is then utilized by the control system to regulate the sensed signal. The additional processing of the error signal is generally referred to as compensation. Amplifiers are used with compensation circuits to provide stability to the amplifier and the control system. In other words, compensation circuits are utilized to shape the magnitude and phase of the transfer function of the amplifier with frequency to achieve the desired frequency response of the amplifier.

FIG. 1 illustrates an example amplifier with compensation 100 which receives a sense signal 112 and reference 114 and outputs a control signal 116. The amplifier 102 shown is a transconductance amplifier with gain G. The inputs to amplifier 102 are voltages while the output of amplifier 102 is a current. Amplifier 102 receives the sensed signal 112 at is non-inverting input and a reference REF 114 at its inverting input. In the depicted example, the output of the amplifier 102 is a current signal substantially equal to the gain G multiplied by the difference between the sensed signal 112 and reference REF 114 (e.g., G(SENSED SIGNAL—REF). If the sensed signal 112 is greater than the reference REF 114, current is sourced by the amplifier 102 (e.g., current is provided by the amplifier 102 to capacitance C1 104). If the sensed signal 112 is less than reference REF 114, current is sinked by the amplifier 102 to return 110 (e.g., current is sinked from capacitance C1 104 to the amplifier 102).

In the depicted example, compensation is provided by capacitance C1 104 and resistance R1 106. As shown, capacitance C1 104 is coupled to the output of amplifier 102 and resistance R1 106 is coupled to capacitance C1 104 and return 110. The voltage across resistance R1 106 is denoted as voltage $V_Z$ 118. Resistance R2 is coupled across capacitance C1 104 and resistance R1 106 and may be used to limit the low frequency gain of amplifier 102. Capacitance C1 104 and resistance R1 106 is generally referred to as Type II compensation of the transconductance amplifier 102.

The transfer function of an output to an input of a circuit, also referred to as the frequency response, is the Laplace transform of the output divided by the input. A "zero" generally refers to the frequencies which result in the numerator of the transfer function becoming zero, and hence the transfer function is substantially zero. A "pole" generally refers to the frequencies which result in the denominator of the transfer function becoming zero, and hence the transfer function is infinite. The frequencies of the poles and zeros generally determine how the magnitude and phase of the transfer function respond over varying frequencies. As such, designing control systems with these poles and zeros in mind can determine the stability of the circuit.

For the example shown in FIG. 1, the transfer function (e.g., frequency response) of the control signal 116 to the difference between the sensed signal 112 and reference 114 is determined by the gain G of amplifier 102, resistances R1 106, R2 109, and capacitance C1 104, with resistance R1 106 contributing the "zero" of the frequency response while capacitance C1 104 contributing the "pole" of the frequency response. The values selected for the gain G, resistances R1 106, R2 109, and capacitance C1 104 determine the frequency of the pole and zero for the compensated amplifier 100 shown in FIG. 1.

The transfer function of the control signal 116 to the difference between the sensed signal 112 and reference 114 of FIG. 1 is shown as equation (1), where "s" represents a complex number:

$$\frac{CONTROL}{SENSED - REF} = GR2 \frac{sR1C1 + 1}{S(R1+R2)C1 + 1} \quad (1)$$

As such, the zero and pole for the transfer function of FIG. 1 may be shown in equations (2) and (3):

$$f_{Z\_FIG1} = \frac{1}{2\pi R1C1} \quad (2)$$

$$f_{P\_FIG1} = \frac{1}{2\pi (R1+R2)C1} \quad (3)$$

If the amplifier 102, resistances R1 106, R2 109, and capacitance C1 104 are external discrete components, there are very few limitations for selecting the values for the gain G, resistances R1 106, R2 109, and capacitance C1 104 to have the desired frequency response and locations for the pole and zero. However, if the amplifier 102, resistances R1 106, R2 109, and capacitance C1 104 are internal components within an integrated circuit, there is a limit to the sizes and values which may be selected for the components due to the physical constraints of integration. As such, there is a limit to the frequency response of the compensated amplifier 100 shown in FIG. 1. For example, for a frequency response with a magnitude of about 50 decibels (dB) with a 100 picofarad (pF) capacitance for capacitance C1 104, the pole is about 25 hertz (Hz) and generally the zero should be around 300 Hz. However, with a 100 pF capacitance for capacitance C1 104, the resistance R1 106 would be around 5.3 megaohms (MΩ), a value which is difficult to integrate into an integrated circuit.

Solutions to compensate an amplifier as shown in FIG. 1 may include passive components, such as resistances and capacitances. In solutions that include passive components, the compensated amplifier 100 may be partially integrated. The first amplifier 102 may integrated while the resistances R1 106 and R2 109 and capacitance C1 104 may be external components. This would generally require a separate pin for compensation in the package which houses the integrated circuit that includes the first amplifier 102.

Embodiments in accordance with the teachings of the present disclosure include a compensated amplifier that utilizes an additional amplifier to provide compensation. In various examples, a first amplifier provides a first error signal representative of a difference between the inputs of the first amplifier. An integrator receives the first error signal and integrates the first error signal. The output of the integrator may be referred to as an integrated error. In the various examples, a second amplifier is also included which is also responsive to the inputs of the first amplifier. For instance, in one example, the second amplifier receives the same inputs as the first amplifier and provides a second error signal representative of a difference between the inputs of the first amplifier. The second error signal is then added to the integrated error to compensate the first amplifier. In one example, the sum of the integrated error from the integrator and the second error signal is utilized as a control signal for a control system, which may be utilized for example in a switched mode power converter. In various examples, the first amplifier, integrator, and second amplifier may all be integrated within an integrated circuit in accordance with the teachings of the present invention.

Figure 2A:
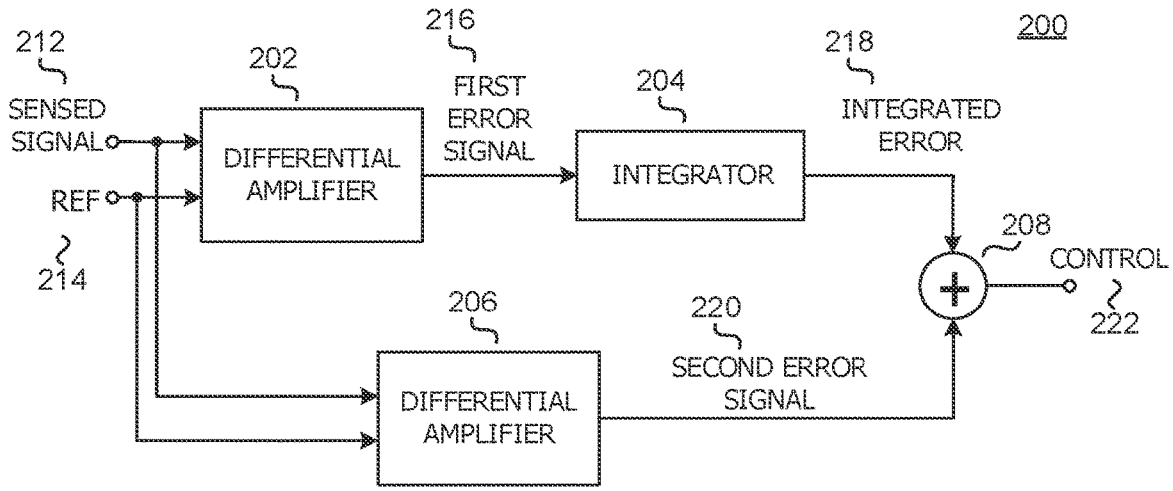
FIG. 2A illustrates a functional block diagram of one example of a compensated amplifier in accordance with the teachings of the present invention.

To illustrate, FIG. 2A illustrates a functional block diagram of one example of a compensated amplifier 200 in accordance with the teachings of the present invention. As shown in the depicted example, the compensated amplifier 200 includes a first amplifier 202, a second amplifier 206, an integrator 204, and an arithmetic operator 208. In the example depicted in FIG. 2A, first amplifier 202 is implemented with a differential amplifier and second amplifier 206 is implemented with a differential amplifier. In the example depicted in FIG. 2A, arithmetic operator 208 is illustrated as an adder (e.g., "+"), which is configured to perform addition. However, it should be appreciated that a subtraction may be considered an addition of a negative value that may be performed by arithmetic operator 208. In one example, the compensated amplifier 200 may be implemented in an integrated circuit, such as a hybrid or monolithic integrated circuit.

In the depicted example, compensated amplifier 200 includes an input that is coupled to receive a sensed signal 212 and a reference signal 214. Compensated amplifier 200 also includes an output that is coupled to output a control signal 222. In the example depicted in FIG. 2A, first and second amplifiers 202 and 206 are coupled to the input to receive the sensed signal 212 and reference signal 214. In one example, sensed signal 212 is representative of a sensed quantity to be regulated while reference signal 214 is representative of a target value to which the sensed quantity is regulated. The compensated amplifier 200 provides signal compensation for the difference between the sensed signal 212 and the reference signal 214 and outputs the control signal 222. Control signal 222 may then be utilized to control one or more parameters to regulate the sensed signal 212. In other words, the second amplifier 206, integrator 204, and arithmetic operator 208 provide signal compensation for the first error signal 216 of the first amplifier 202.

As shown in the example of FIG. 2A, first amplifier 202 is coupled to receive the sensed signal 212 and the reference signal 214 and outputs a first error signal 216. Functionally, the first amplifier 202 provides an output which is a scaled version of the difference between its inputs. The scaling factor may be referred to as the gain. As shown, the first error signal 216 is the difference between sensed signal 212 and reference signal 214 multiplied by the gain of first amplifier 202. In another example, the first error signal 216 may be the difference between reference signal 214 and sensed signal 212 multiplied by the gain of first amplifier 202. Example implementations of the first amplifier 202 include an operation amplifier with gain A1, or a transconductance amplifier with gain G1.

For an example of the first amplifier 202 implemented with an operational amplifier, the sensed signal 212 and the reference signal 214 are voltages and the first error signal 216 is a voltage. For an example of the first amplifier 202 implemented with a transconductance amplifier, the sensed signal 212 and the reference signal 214 are voltages and the first error signal 216 is a current.

As shown in the depicted example, integrator 204 receives the first error signal 216 and integrates the first error signal 216 to output an integrated error 218. The integrated error 218 may be a voltage or current signal. One example of integrator 204 may be a capacitance. In one example, first amplifier 202 and integrator 204 may be implemented with an operational amplifier integrator.

In the example illustrated in FIG. 2A, second amplifier 206 is coupled to receive the sensed signal 212 and the reference signal 214 and outputs the second error signal 220. It is appreciated therefore that the inputs of the first amplifier 206 are coupled together with the inputs of the second amplifier 206 to receive the sensed signal 212 and the reference signal 214. Functionally, the second amplifier 206 also provides an output that is responsive to the sensed signal 212 and the reference signal 214, which in one example is a scaled value of the difference between the sensed signal 212 and the reference signal 214. The scaling factor is referred to as the gain. In the example illustrated in FIG. 2A, the second error signal 220 is the difference between sensed signal 212 and reference signal 214 multiplied by the gain of second amplifier 206. In another example, the second error signal 220 may be the difference between reference signal 214 and sensed signal 212 multiplied by the gain of second amplifier 206. Examples of the second amplifier 206 include an operational amplifier with gain A2, or a transconductance amplifier with gain G2.

For an example of the second amplifier 206 implemented with an operational amplifier, the sensed signal 212 and the reference signal 214 are voltages and the second error signal 220 is a voltage. For an example of the first amplifier 206 implemented with a transconductance amplifier, the sensed signal 212 and the reference signal 214 are voltages and the second error signal 220 is a current.

As shown in the example depicted in FIG. 2A, arithmetic operator 208 receives the integrated error 218 and second error signal 220 and outputs the control signal 222. As shown, the control signal 222 is the summation of the integrator error 218 and second error signal 220. While the arithmetic operator 208 depicted in FIG. 2A illustrates addition (e.g., "+"), it should be appreciated that subtraction may also be utilized and may be considered the addition of a negative value. As will be discussed further, the properties of the first amplifier 202, integrator 204, and second amplifier 208 determines the transfer function between the control signal 222 and the difference between the sensed signal 212 and reference signal 214 in accordance with the teachings of the present invention.

Figure 2B:
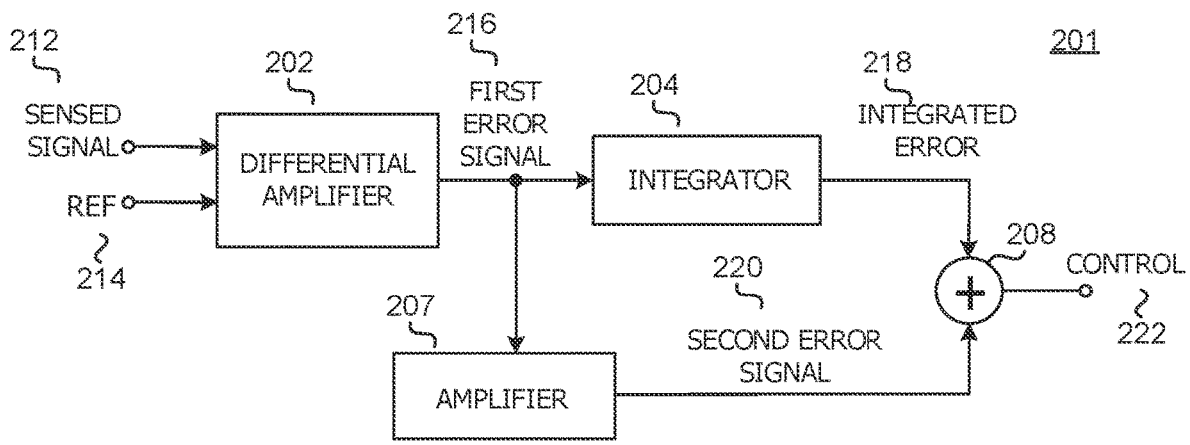
FIG. 2B illustrates a functional block diagram of another example of a compensated amplifier in accordance with the teachings of the present invention.

FIG. 2B illustrates a functional block diagram of another example of a compensated amplifier 201 in accordance with the teachings of the present invention. It is appreciated that the example compensated amplifier 201 depicted in FIG. 2B shares similarities with the example compensated amplifier 200 depicted in FIG. 2A, and similarly named and numbered elements described above are coupled and function similarly below. For instance, as shown in the example depicted in FIG. 2B, the compensated amplifier 201 includes a first amplifier 202, a second amplifier 207, an integrator 204, and an arithmetic operator 208. In the example, the first amplifier 202 and second amplifier 207 are configured to be responsive to the sensed signal 212 and the reference signal 214 to generate the first error signal 216 and the second error signal 220, respectively. In the example depicted in FIG. 2B, arithmetic operator 208 is illustrated as an adder (e.g., "+"), which is configured to perform addition. However, it should be appreciated that a subtraction may be considered an addition of a negative value that may be performed by arithmetic operator 208.

One difference between example compensated amplifier 201 of FIG. 2B and example compensated amplifier 200 of FIG. 2A, is that in the example depicted in FIG. 2B first amplifier 202 is implemented with differential amplifier and second amplifier 207 is implemented with an amplifier having an input coupled to the output of first amplifier 202. Thus, the second amplifier 207 of example compensated amplifier 201 replaces the second amplifier 206 of compensated amplifier 200. As shown in the example depicted in FIG. 2B, second amplifier 207 is coupled to receive the first error signal 216, which is responsive to the sensed signal 212 and the reference signal 214, and outputs the second error signal 220 in response. In one example, the compensated amplifier 201 may be implemented in an integrated circuit, such as a hybrid or monolithic integrated circuit.

In the example depicted in FIG. 2B, compensated amplifier 201 also receives the sensed signal 212 and the reference signal 214 at its input and outputs a control signal 222. As mentioned, first amplifier 202 of compensated amplifier 201 also receives sensed signal 212 and reference signal 214. In one example, sensed signal 212 is representative of a sensed quantity to be regulated while reference signal 214 is representative of the target value to which the sensed quantity is regulated. The compensated amplifier 201 provides signal compensation for the difference between the sensed signal 212 and the reference signal 214 and outputs the control signal 222. Control signal 222 may then be utilized to control one or more parameters to regulate the sensed signal 212. In other words, the second amplifier 207, integrator 204, and arithmetic operator 208 provide signal compensation for the first error signal 216 of the first amplifier 202 in accordance with the teachings of the present invention.

As shown, first amplifier 202 is coupled to receive the sensed signal 212 and the reference signal 214 and outputs the first error signal 216. Functionally, the first amplifier 202 provides an output which is a scaled version of the difference between its inputs. The scaling factor may be referred to as the gain. As shown, the first error signal 216 is the difference between sensed signal 212 and reference signal 214 multiplied by the gain of first amplifier 202. In another example, the first error signal 216 is the difference between reference signal 214 and sensed signal 212 multiplied by the gain of first amplifier 206. Examples of the first amplifier 202 include an operation amplifier with gain A1, or a transconductance amplifier with gain G1.

For an example of the first amplifier 202 implemented with an operational amplifier, the sensed signal 212 and the reference signal 214 are voltages and the first error signal 216 is a voltage. For an example of the first amplifier 202 implemented with a transconductance amplifier, the sensed signal 212 and the reference signal 214 are voltages and the first error signal 216 is a current.

As shown in the depicted example, integrator 204 receives the first error signal 216 and integrates the first error signal 216 to output an integrated error 218. The integrated error 218 may be a voltage or current signal. One example of integrator 204 may be a capacitance.

In the example illustrated in FIG. 2B, second amplifier 207 is coupled to the output of the first amplifier 202 to receive the first error signal 216 to output the second error signal 220 in response. Functionally, the second amplifier 207 provides an output that is a scaled value of its input, the first error signal 216, which is responsive to the sensed signal 212 and the reference signal 214. The scaling factor is referred to as the gain. Thus, the second error signal 220 is the first error signal 216 multiplied by the gain of second amplifier 207.

As shown in the example depicted in FIG. 2B, arithmetic operator 208 receives the integrated error 218 and second error signal 220 and outputs the control signal 222. As shown, the control signal 222 is the summation of the integrator error 218 and second error signal 220. While the arithmetic operator 208 depicted in FIG. 2A illustrates addition (e.g., "+"), it should be appreciated that subtraction may also be utilized and may be considered the addition of a negative value. As will be discussed further, the properties of the first amplifier 202, integrator 204, and second amplifier 207 determines the transfer function between the control signal 222 and the difference between the sensed signal 212 and reference signal 214 in accordance with the teachings of the present invention.

Figure 2C:
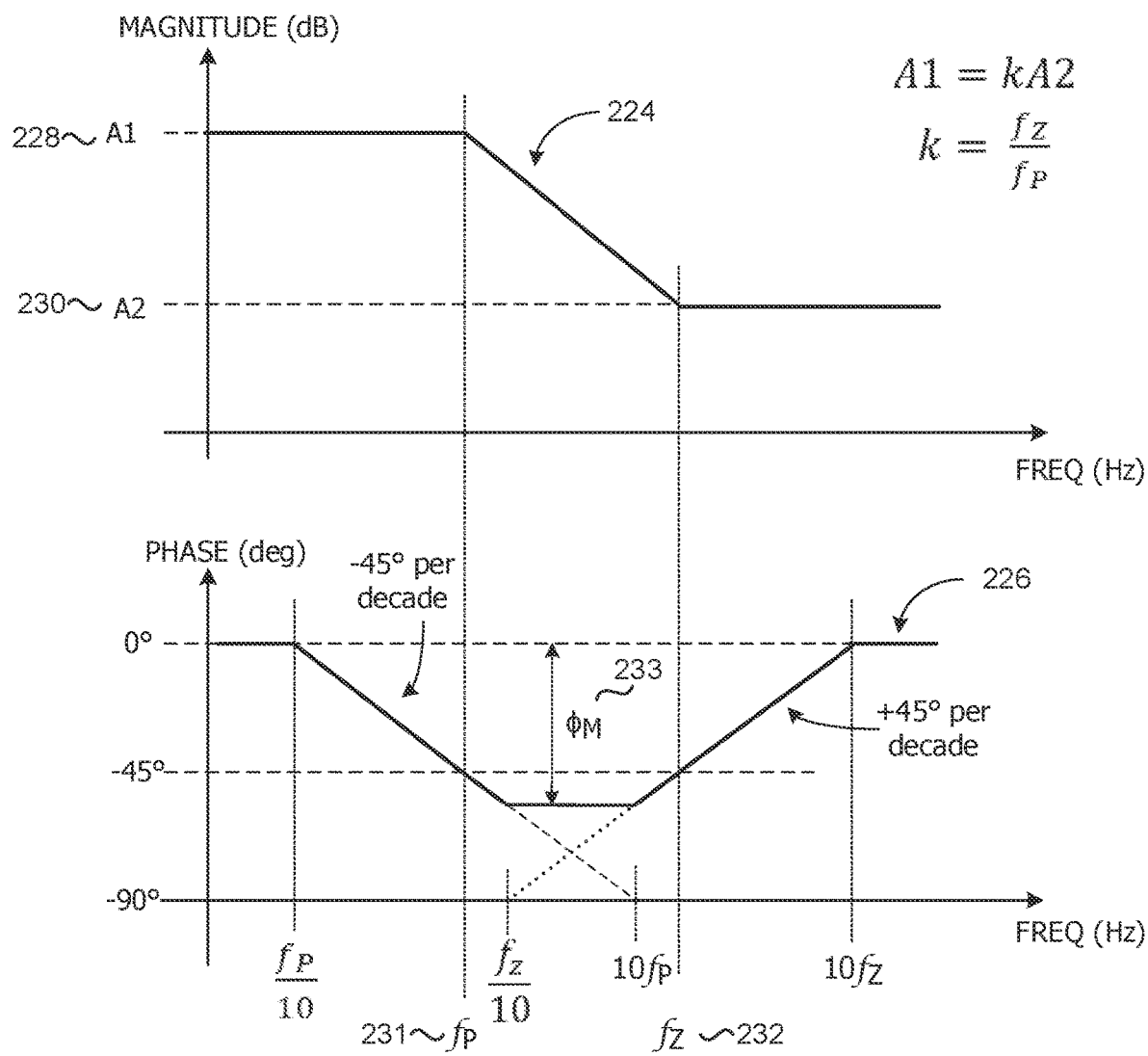
FIG. 2C illustrates example straight-line Bode plot diagrams of the magnitude and phase of the frequency response of the control signal to the difference between the sensed signal and reference in an example compensated amplifier in accordance with the teachings of the present invention.

FIG. 2C illustrates example straight-line Bode plot diagrams of the magnitude and phase of the frequency response of the control signal to the difference between the sensed signal and reference in an example compensated amplifier in accordance with the teachings of the present invention. It should be appreciated that the straight-line Bode diagrams shown in FIG. 2C are approximations of the frequency response of the compensated amplifiers discussed in this disclosure.

As shown in FIG. 2C, the upper plot illustrates the magnitude 224 of the frequency response of the of the control signal to the difference between the sensed signal and reference with the x-axis being frequency in Hertz (Hz) and the y-axis being the magnitude in decibels (dB). The lower plot illustrates the phase 226 of the frequency response of the control signal to the difference between the sensed signal and reference with the x-axis being frequency in Hertz (Hz) and the y-axis being the phase in degrees. As shown, the compensated amplifier has one pole with a pole frequency $f_P$ 231 and one zero with a zero frequency $f_Z$ 232. It should be appreciated that poles generally contribute to a decrease in phase while zeros contribute increases in phase.

As shown in the upper plot, the magnitude 224 is substantially constant at value A1 for frequencies less than the pole frequency $f_P$ 231 of the compensated amplifier and is substantially constant at value A2 for frequencies greater than the zero frequency $f_Z$ 232. Between the pole frequency $f_P$ 231 and the zero frequency $f_Z$ 232, the magnitude 224 decreases from value A1 to value A2. The value A1 is substantially equal to k times A2, or mathematically: A1=kA2. With the zero frequency $f_Z$ 232 and pole frequency $f_P$ 231 as shown in FIG. 2C, the ratio of k is therefore mathematically:

$$k = \frac{f_Z}{f_P}.$$

The phase 226 is shown in a dark solid line in the lower plot of FIG. 2C. The phase 226 is substantially zero degrees for frequencies below one-tenth the pole frequency, e.g., $f_P/10$, and for frequencies greater than ten times the zero frequency, e.g., 10 $f_Z$. A pole to the system contributes a phase decrease of 45 degrees per decade (e.g., −45°/decade) while a zero contributes phase increases of 45 degrees per decade (e.g., +45°/decade). At one-tenth the pole frequency $$\frac{f_P}{10},$$

the phase 226 decreases at with a slope of 45 degrees per decade (e.g., −45°/decade). At the pole frequency $f_P$ 231, the phase is substantially minus 45 degrees (e.g., −45°). The thin dashed line in the lower plot of FIG. 2C between one-tenth the zero frequency $$\frac{f_Z}{10}$$

and ten times the pole frequency 10 $f_P$ illustrates the trajectory contributed by the pole of the compensated amplifier, while the dotted line between one-tenth the zero frequency $$\frac{f_Z}{10}$$

and ten times the pole frequency 10 $f_P$ illustrates the trajectory contributed by the zero of the compensated amplifier. As shown, between one-tenth the zero frequency $$\frac{f_Z}{10}$$

and ten times the pole frequency 10 $f_P$, the phase 226 is substantially constant as the decrease contributed by the pole is substantially offset by the increase contributed by the zero. At ten times the pole frequency 10 $f_P$, the phase 226 increases with a slope of 45 degrees per decade (e.g., +45°/decade). At the zero frequency $f_Z$ 232, the phase 226 is also substantially minus 45 degrees (e.g., −45°). At ten times the zero frequency 10 $f_Z$, the phase 226 has reached zero degrees. The phase margin $\phi_M$ 233 is shown as the difference between zero degrees and the minimum phase value reached.

Figure 3:
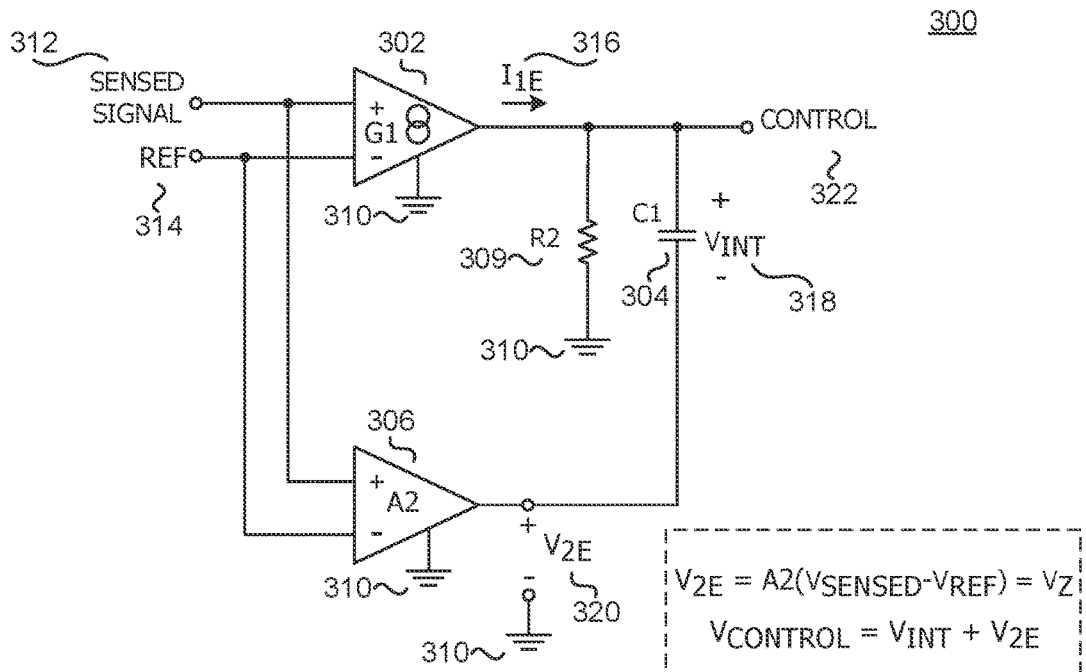
FIG. 3 is a schematic of one example of a compensated amplifier in accordance with the teachings of the present invention.

FIG. 3 is a schematic of one example of a compensated amplifier 300 in accordance with the teachings of the present invention. It is appreciated that the example compensated amplifier 300 illustrated in FIG. 3 may be an example of compensated amplifier 200 shown in FIG. 2A, and that similarly named and numbered elements described above are coupled and function similarly below.

As shown in the depicted example, compensated amplifier 300 is shown as receiving at its input, the sensed signal 312 and reference signal 314, and outputting the control signal 322. For the example shown, sensed signal 312, reference 314, and control signal 322 are voltages. Compensated amplifier 300 is also shown including a first amplifier 302, a capacitance C1 304 (e.g., capacitor C1), a second amplifier 306, and a resistance R2 309 (e.g., resistor R2). In the depicted example, first amplifier 302 may be implemented with a differential amplifier and second amplifier 306 may be implemented with a differential amplifier. It should be appreciated that the first amplifier 302 is one example of first amplifier 202, second amplifier 306 is one example of second amplifier 206, and capacitance C1 304 is one example of integrator 204 of FIG. 2A. As will be discussed further, the addition provided by arithmetic operator 208 of FIG. 2A is performed in conjunction with the capacitance C1 304, which is coupled to the output of second amplifier 306 of FIG. 3. In one example, the compensated amplifier 300 may be implemented in an integrated circuit, such as a hybrid or monolithic integrated circuit.

The first amplifier 302 is shown as a transconductance amplifier with gain G1. The first amplifier 302 receives the sensed signal 312 at its non-inverting input and the reference signal 314 at its inverting input. The output of the first amplifier 302 is the first error signal $I_{IE}$ 316. For the example shown, the sensed signal 312 and reference signal 314 are voltages while the first error signal $I_{IE}$ 316 is a current. The first error signal $I_{IE}$ 316 of FIG. 3 is substantially the difference between the sensed signal 312 and reference signal 314 multiplied by the gain G1, or mathematically:

$$I_{1E\_FIG3} = G1(V_{SENSED} - V_{REF}) \tag{4}$$

The direction of current for the first error signal $I_{IE}$ 316 depends on whether the sensed signal 312 is greater or less than the reference signal 314. If the sensed signal 312 is greater than the reference signal 314, the first error signal $I_{IE}$ 316 is sourced to the capacitance C1 304 (e.g., the current flows from the output of the first amplifier 302 to the capacitance C1 304). If the reference signal 314 is greater than the sensed signal 312, the first error signal $I_{IE}$ 316 is sinked to return 310 (e.g., the current flows to the output of the first amplifier 302).

The second amplifier 306 is shown as an operational amplifier with gain A2. First amplifier 302 and second amplifier 306 are referenced to return 310. The second amplifier 306 receives the sensed signal 312 at its non-inverting input and the reference signal 314 at its inverting input. The output of the second amplifier 306 is the second error signal $V_{2E}$ 320. For the example shown, the sensed signal 312, reference signal 314, and second error signal $V_{2E}$ 320 are voltages. The second error signal $V_{2E}$ 320 of FIG. 3 is substantially the difference between the sensed signal 312 and reference signal 314 multiplied by the gain A2, or mathematically:

$$V_{2E\_FIG3} = A2(V_{SENSED} - V_{REF}) \tag{5}$$

As shown in the illustrated example, resistance R2 309 is coupled between the output of first amplifier 302 and return 310. In the example, resistance R2 309 may be used to limit the low frequency gain of first amplifier 302. Capacitance C1 304 is coupled between the output of the first amplifier 302 and the output of second amplifier 306. The voltage across the capacitance C1 is the integrated error $V_{INT}$ 318.

Control signal 322 is a voltage taken from a node coupled to the output of the first amplifier 302, resistance R2 309 and capacitance C1 304. As shown in FIG. 3, the control signal 322 of FIG. 3 is substantially the sum of the integrator error $V_{INT}$ 318 across capacitance C1 304 and the second error signal $V_{2E}$ 320, or mathematically:

$$V_{CONTROL\_FIG3} = V_{INT} + V_{2E\_FIG3}. \tag{6}$$

In various examples, it is appreciated that the implementation of the compensated amplifier 300 shown in FIG. 3 may be utilized to replace the compensated amplifier 100 shown in FIG. 1 to remove the external components and integrate the components into an integrated circuit. For the example shown in FIG. 1, the control signal 116 is substantially the sum of the voltage across capacitance C1 104 and resistance R1 106 (shown as voltage $V_Z$ 118). In one example, the values for the gain G1 of the first amplifier 302, resistance R2 309, capacitance C1 304 and gain A2 of the second amplifier 306 may be selected such that the second error signal $V_{2E}$ 320 of FIG. 3 is substantially equal to the voltage $V_Z$ 118 shown in FIG. 1. As such, the compensated amplifier 300 shown in FIG. 3 may be utilized to replace the compensated amplifier 100 shown in FIG. 1.

For example, the transfer function between the control signal 322 and the difference between the sensed signal 312 and reference signal 314 for the compensated amplifier 300 of FIG. 3 may be substantially:

$$\frac{\text{CONTROL}}{\text{SENSED} - \text{REF}} = (A2 + G1R2) \frac{s\frac{A2R2}{A2 + G1R2}C1 + 1}{SR2C1 + 1}. \quad (7)$$

If gain A2 is much less than the product of gain G1 and resistance R2 309, or mathematically: A2<<G1R2, the approximation of the transfer function between the control signal 322 and the difference between the sensed signal 312 and reference signal 314 for the compensated amplifier 300 of FIG. 3 may be substantially:

$$\frac{\text{CONTROL}}{\text{SENSED} - \text{REF}} = G1R2 \frac{s\frac{A2}{G1}C1 + 1}{SR2C1 + 1}. \quad (8)$$

If the gain A2 and gain G1 are selected such that the quotient of gain A2 divided by gain G1 is substantially equal to the value of resistance R1 106 of FIG. 1, or mathematically:

$$\frac{A1}{G1} = R_1,$$

then the frequency of the zero for the compensated amplifier 300 of FIG. 3 may be substantially:

$$f_{Z\_FIG3} = \frac{1}{2\pi \frac{A2}{G1} C1}. \quad (9)$$

As such, the frequency of the zero for the compensated amplifier 300 of FIG. 3 may be selected without the use of an external resistor R1 106 as shown in FIG. 1. As previously mentioned, the resistance value needed for resistor R1 106 of FIG. 1 may be physically unrealistically large to be integrated into an integrated circuit chip. Conversely, if the resistance value selected for resistor R1 106 is fixed for FIG. 1, the resultant capacitance C1 104 may be physically unrealistically large to be integrated into an integrated circuit chip. By eliminating the need resistance R1 106 shown in FIG. 1, the compensated amplifier 300 as shown in FIG. 3 may be integrated in either a hybrid or monolithic integrated circuit in accordance with the teachings of the present invention.

Figure 4:
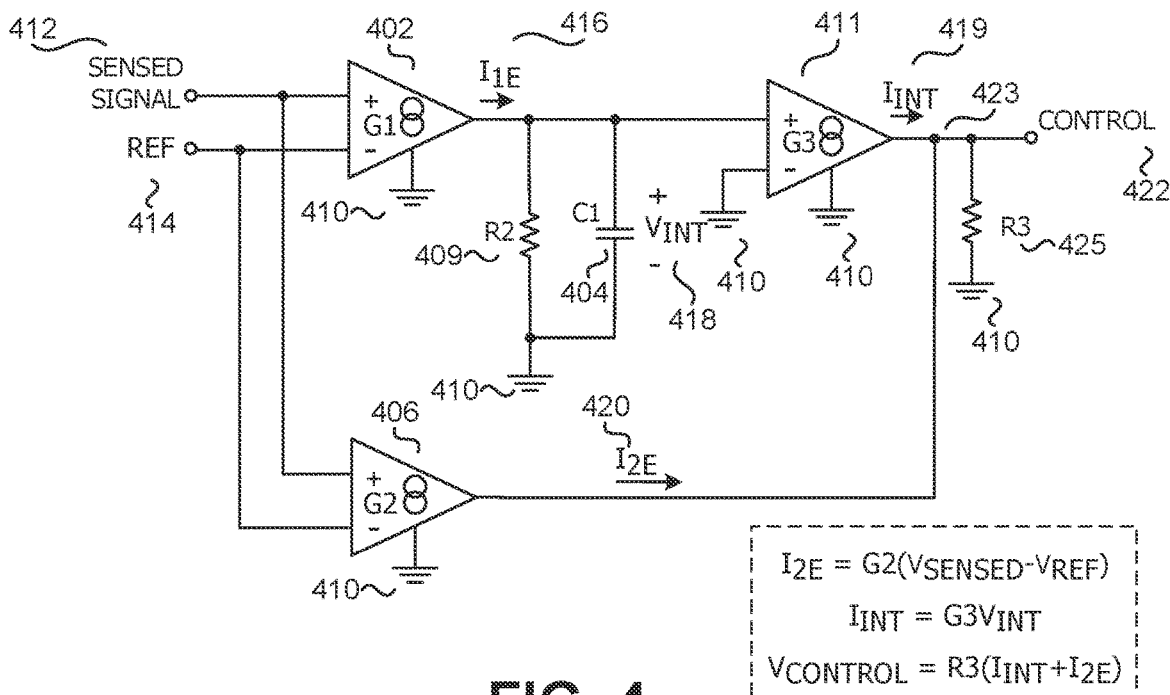
FIG. 4 is a schematic of another example of a compensated amplifier in accordance with the teachings of the present invention.

FIG. 4 is a schematic of another example of a compensated amplifier 400 in accordance with the teachings of the present invention. It is appreciated that the example compensated amplifier 400 illustrated in FIG. 4 may be another example of the example compensated amplifier 300 illustrated in FIG. 3 or the example compensated amplifier 200 shown in FIG. 2A, and that similarly named and numbered elements described above are coupled and function similarly below.

As shown in the depicted example, compensated amplifier 400 is shown as receiving at its input, the sensed signal 412 and reference signal 414, and outputting the control signal 422. For the example shown, sensed signal 412, reference signal 414, and control signal 422 are voltages. However, it should be appreciated that in another example, the control signal 422 may be a current. Compensated amplifier 400 is also shown including a first amplifier 402, a capacitance C1 404 (e.g., capacitor C1), a second amplifier 406, resistance R2 409 (e.g., resistor R2), a third amplifier 411, and resistance R3 425 (e.g., resistor 425). In the depicted example, first amplifier 402 may be implemented with a differential amplifier, second amplifier 406 may be implemented with a differential amplifier, and third amplifier 411 may be implemented with a differential amplifier. It should be appreciated that the first amplifier 402 is one example of first amplifier 202, second amplifier 406 is one example of second amplifier 206, and capacitance C1 404 is one example of integrator 204 of FIG. 2A. As will be discussed further detail below, the addition provided by arithmetic operator 208 of FIG. 2A is performed at node 423 in FIG. 4. As mentioned, it is appreciated that the example depicted in FIG. 4 shares many similarities with FIG. 3, and that similarly named and numbered elements described above are coupled and function similarly below. At least one difference between the example depicted in FIG. 4 and the example depicted in FIG. 3 is the second amplifier 406 depicted in FIG. 4 is shown as a transconductance amplifier. In one example, the compensated amplifier 400 may be implemented in an integrated circuit, such as a hybrid or monolithic integrated circuit.

The first amplifier 402 is shown as a transconductance amplifier in FIG. 4 with gain G1 and is referenced to return 410. The first amplifier 402 receives the sensed signal 412 at its non-inverting input and the reference signal 414 at its inverting input. The output of the first amplifier 402 is the first error signal $I_{IE}$ 416. For the example shown, the sensed signal 412 and reference signal 414 are voltages while the first error signal $I_{IE}$ 416 is a current. The first error signal $I_{IE}$ 416 in FIG. 4 is substantially the difference between the sensed signal 412 and reference signal 414 multiplied by the gain G1, or mathematically:

$$I_{1E\_FIG4} = G1(V_{SENSED} - V_{REF}) \quad (10)$$

The direction of current for the first error signal $I_{IE}$ 416 depends on whether the sensed signal 412 is greater or less than the reference signal 414. If the sensed signal 412 is greater than the reference signal 414, the first error signal $I_{IE}$ 416 is sourced to the capacitance C1 404 (e.g., the current flows from the output of the first amplifier 402 to the capacitance C1 404). If the reference signal 414 is greater than the sensed signal 412, the first error signal $I_{IE}$ 416 is sinked to return 410 (e.g., the current flows to the output of the first amplifier 402).

The example second amplifier 406 in FIG. 4 is shown as a transconductance amplifier with gain G2 and referenced to return 410. The second amplifier 406 receives the sensed signal 412 at its non-inverting input and the reference signal 414 at its inverting input. The output of the second amplifier 406 is the second error signal $I_{2E}$ 420. For the example shown, the second error signal $I_{2E}$ 420 is a current. The second error signal $I_{2E}$ 420 in FIG. 4 is substantially the difference between the sensed signal 412 and reference signal 414 multiplied by the gain G2, or mathematically:

$$I_{2E\_FIG4} = G2(V_{SENSED} - V_{REF}) \quad (11)$$

The direction of current for the second error signal $I_{2E}$ 420 depends on whether the sensed signal 412 is greater or less than the reference signal 414. If the sensed signal 412 is greater than the reference signal 414, the second error signal $I_{2E}$ 420 is sourced to node 423 (e.g., the current flows from the output of the second amplifier 406 to node 423). If the reference signal 414 is greater than the sensed signal 412, second error signal $I_{2E}$ 420 is sinked to return 410 (e.g., the current flows from node 423 to the output of the second amplifier 406).

Capacitance C1 404 is coupled between the output of first amplifier 402 and return 410 and integrates the first error signal $I_{1E}$ 416. Resistance R2 409 is coupled across capacitance C1 404 and may be used to limit the low frequency gain of amplifier 402. The voltage across the capacitance C1 404 is the integrated error $V_{INT}$ 418.

Third amplifier 411 is shown as a transconductance amplifier with gain G3 and referenced to return 410. In the depicted example, the third amplifier 411 provides a voltage to current converter, which is configured to convert the integrated error $V_{INT}$ 418 into a current, $I_{INT}$ 419. The third amplifier 411 is coupled to receive the integrated error $V_{INT}$ 418 at its non-inverting input and its inverting input is coupled to return 410. The output of the third amplifier 406 is the integrated error current $I_{INT}$ 419, which is a current signal. The integrated error current $I_{INT}$ 419 of FIG. 4 is substantially the integrated error $V_{INT}$ 418 multiplied by the gain G3, or mathematically:

$$I_{INT\_FIG4} = G3 V_{INT}. \tag{12}$$

Control signal 422 is a voltage taken from node 423. As shown, the output of the third amplifier 411 and resistance R3 426 are coupled to node 423. Since the integrated error current $I_{INT}$ 419 and second error signal $I_{2E}$ 420 are currents, the summation of the integrated error current $I_{INT}$ 419 and second error signal $I_{2E}$ 420 occurs at node 423. As shown in FIG. 4, the resistance R3 426 is coupled to the node 423 and the control signal 422 of FIG. 4 is the voltage drop across resistance R3 426, which is substantially equal to the resistance value of resistance R3 426 multiplied by the sum of the integrated error current $I_{INT}$ and the second error signal $I_{2E}$ 420, or mathematically:

$$V_{CONTROL\_FIG4} = R3(I_{INT} + I_{2E\_FIG4}). \tag{13}$$

Although control signal 422 is a voltage in the example shown in FIG. 4, it is appreciated that another example, the control signal 422 could also be a current signal in accordance with the teachings of the present invention.

Figure 5:
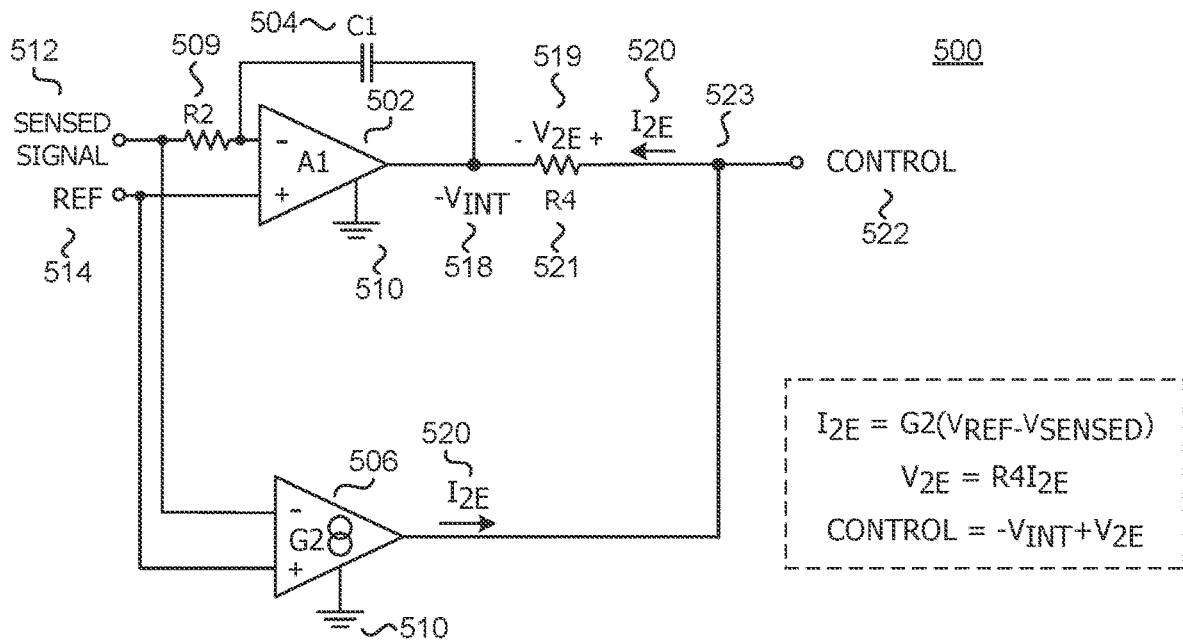
FIG. 5 is a schematic of yet another example of a compensated amplifier in accordance with the teachings of the present invention.

FIG. 5 is a schematic of yet another example of a compensated amplifier 500 in accordance with the teachings of the present invention. It is appreciated that the example compensated amplifier 500 illustrated in FIG. 5 may be another example of the example compensated amplifier 400 illustrated in FIG. 4, or another example of the example compensated amplifier 300 illustrated in FIG. 3 or the example compensated amplifier 200 shown in FIG. 2A, and that similarly named and numbered elements described above are coupled and function similarly below.

As shown in the depicted example, compensated amplifier 500 is shown as receiving at its input, the sensed signal 512 and reference signal 514, and outputting the control signal 522. For the example shown, sensed signal 512, reference signal 514, and control signal 522 are voltages. However, it should be appreciated that in another example, the control signal 522 may be a current. Compensated amplifier 500 is also shown including a first amplifier 502, a capacitance C1 504 (e.g., capacitor C1), a second amplifier 506, resistance R2 509 (e.g., resistor R2), and resistance R4 521 (e.g., resistor R4). In the depicted example, first amplifier 502 may be implemented with an operational amplifier and second amplifier 506 may be implemented with a differential amplifier.

It should be appreciated that the first amplifier 202 and integrator 204 of the example depicted in FIG. 2A are implemented with an operational amplifier integrator in FIG. 5 with the first amplifier 502 along with resistance R2 509 and capacitance C1 504. It is also noted that the second amplifier 506 of FIG. 5 is one example of the second amplifier 206 of FIG. 2A. As will be discussed further, the addition provided by arithmetic operator 208 of FIG. 2A is provided in FIG. 5 by utilizing a resistance R4 521 that is coupled to the output of the first amplifier 502. The control signal 522 is shown as the voltage at a node 523 between resistance R4 521 and an output of second amplifier 506. In one example, the compensated amplifier 500 may be implemented in an integrated circuit, such as a hybrid or monolithic integrated circuit.

As mentioned, first amplifier 502 is shown in FIG. 5 as an operational amplifier with gain A1. The first amplifier 502, capacitance C1 504, and resistance R2 509 are coupled together as an operational amplifier integrator. In particular, the operational amplifier integrator that includes first amplifier 502, capacitance C1 504, and resistance R2 509 is coupled to provide a negative output that is proportional to the integral of the difference between the reference signal 514 and the sensed signal 512. For the example shown, the sensed signal 512 and reference signal 514 are voltages. As shown in the depicted example, the reference signal 514 is coupled to the non-inverting input of the first amplifier 502 while the sensed signal 512 is coupled to the inverting input of first amplifier 502 through resistance R2 509 as shown. Capacitance C1 504 is coupled between the output of the first amplifier 502 and the inverting input of first amplifier 502. The output of the first amplifier 502, which is coupled as an operational amplifier integrator with capacitance C1 504 and resistance R2 509 as discussed, is denoted as the negative integrated error, e.g., $-V_{INT}$ 518. The first amplifier 502 is referenced to return 510.

The second amplifier 506 is shown as a transconductance amplifier with gain G2. The second amplifier 506 receives the sensed signal 512 at its non-inverting input and the reference signal 514 at its inverting input. The output of the second amplifier 506 is the second error signal $I_{2E}$ 520. For the example shown, the second error signal $I_{2E}$ 520 is a current. The second amplifier 506 is referenced to return 510. The second error signal $I_{2E}$ 520 of FIG. 5 is substantially the difference between the reference signal 514 and the sensed signal 512 multiplied by the gain G2, or mathematically:

$$I_{2E\_FIG5} = G2(V_{REF} - V_{SENSED}) \tag{14}$$

The direction of the second error signal $I_{2E}$ 520 depends on whether the reference signal 514 or the sensed signal 512 is greater. If the reference signal 514 is greater than the sensed signal 512, the second error signal $I_{2E}$ 520 is sourced to resistance R4 521 (e.g., the direction of current is from the output of the second amplifier to node 523). However, if the sensed signal 512 is greater than the reference signal 514, the second error signal $I_{2E}$ 520 is sinked to return 510 (e.g., the direction of current is from node 523 to the output of the second amplifier 506).

As shown in the example depicted in FIG. 5, one end of resistance R4 521 is coupled to the output of the first amplifier 502 and capacitance C1 504 while the other end of resistance R4 is coupled to node 523. The voltage drop across the resistance R4 521 is denoted as $V_{2E}$ 519 and may be the voltage value of the second error signal $I_{2E}$ 520. As shown, the resistance R4 521 acts as a current to voltage converter, which converts the current value of the second error signal $I_{2E}$ 520 to the voltage $V_{2E}$ 519. As such, the voltage $V_{2E}$ 519 of FIG. 5 is the value of resistance R4 521 multiplied by the current value of the second error signal $I_{2E}$ 520, or mathematically:

$$V_{2E\_FIG5} = R4 I_{2E}. \tag{15}$$

The control signal 522 is substantially the voltage at node 523. In the depicted example, the control signal 522 of FIG. 5 is substantially the sum of the voltage of the integrator error $-V_{INT}$ 518 and the voltage drop $V_{2E}$ 519 across resistance R4 519, which representative of the second error signal $I_{2E}$ 520, or mathematically:

$$V_{CONTROL\_FIG5} = -V_{INT} + V_{2E\_FIG5}. \tag{16}$$

Figure 6:
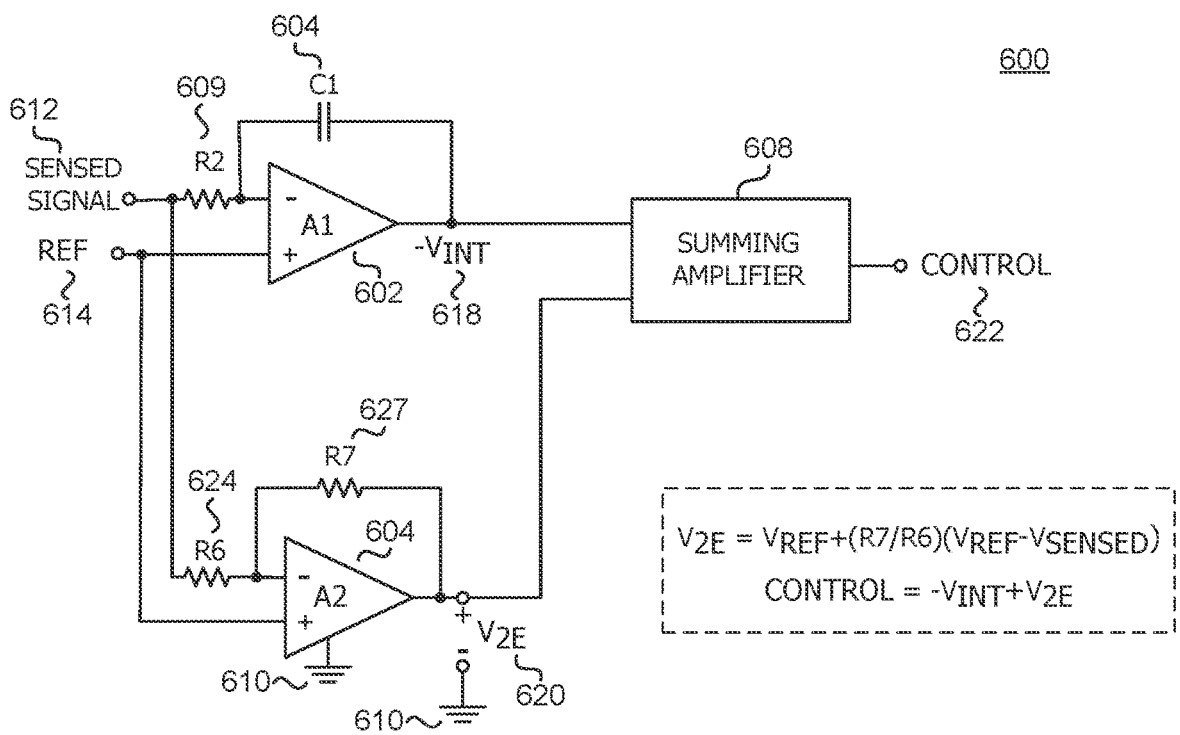
FIG. 6 is a schematic of still another example of a compensated amplifier in accordance with the teachings of the present invention.

FIG. 6 is a schematic of still another example of a compensated amplifier 600 in accordance with the teachings of the present invention. It is appreciated that the example compensated amplifier 600 illustrated in FIG. 6 may be another example of compensated amplifier 500 illustrated in FIG. 5, or another example of compensated amplifier 400 illustrated in FIG. 4, or another example of the example compensated amplifier 300 illustrated in FIG. 3 or the example compensated amplifier 200 shown in FIG. 2A, and that similarly named and numbered elements described above are coupled and function similarly below.

As shown in the depicted example, compensated amplifier 600 is shown as receiving at its input, the sensed signal 612 and reference signal 614, and outputting the control signal 622. For the example shown, sensed signal 612, reference signal 614, and control signal 622 are voltages. However, it should be appreciated that in another example, the control signal 622 may be a current. Compensated amplifier 600 is also shown including a first amplifier 602, a capacitance C1 604 (e.g., capacitor C1), a second amplifier 606, resistance R2 609 (e.g., resistor R2), a summing amplifier 608, resistance R6 624 (e.g., resistor R6), and resistance R7 627 (e.g., resistor R7). In the depicted example, first amplifier 602 may be implemented with an operational amplifier and second amplifier 606 may be implemented with an operational amplifier.

Similar to the example depicted in FIG. 5, it should be appreciated that the first amplifier 202 and integrator 204 of the example depicted in FIG. 2A are implemented with an operational amplifier integrator in FIG. 6 with the first amplifier 602 along with resistance R2 609 and capacitance C1 604. It is also noted that the second amplifier 606 of FIG. 6 is one example of second amplifier 206 of FIG. 2A. As will be discussed further, the addition provided by arithmetic operator 208 of FIG. 2A is provided in FIG. 6 by summing amplifier. The control signal 622 is shown as the output of the summing amplifier 608. In one example, the compensated amplifier 600 may be implemented in an integrated circuit, such as a hybrid or monolithic integrated circuit.

As mentioned, the first amplifier 602 is shown in FIG. 6 as an operational amplifier with gain A1. The first amplifier 602, capacitance C1 604, and resistance R2 609 are coupled together as an operational amplifier integrator. In particular, the first amplifier 602, capacitance C1 604, and resistance R2 609 are coupled to provide a negative output that is proportional to the integral of the difference between the reference signal 614 and the sensed signal 612. For the example shown, the sensed signal 612 and reference signal 614 are voltages. As shown in the depicted example, reference signal 614 is coupled to the non-inverting input of the first amplifier 602 while the sensed signal 612 is coupled to inverting input of first amplifier 602 through resistance R2 609. Capacitance C1 604 is coupled between the output of the first amplifier 602 and the inverting input of first amplifier 602. The output of the first amplifier 602, which is coupled as an operational amplifier integrator with capacitance C1 604 and resistance R2 609 as discussed, is denoted as the negative integrated error, e.g., $-V_{INT}$ 618. The first amplifier 602 is referenced to return 610.

The second amplifier 606 is shown as an operational amplifier with gain A2. Resistances R6 and R7 are coupled as a feedback circuit for the second amplifier 606. The sensed signal 612 is coupled to the inverting input of the second amplifier 606 through resistance R6 624, while the non-inverting input is coupled to receive the reference signal 614. Resistance R7 627 is shown as being coupled between the output of the second amplifier 606 and its inverting input. The output of the second amplifier 606 is the second error signal $V_{2E}$ 620. For the example shown, the second error signal $V_{2E}$ 620 is a voltage. The second amplifier 606 is referenced to return 610. The second error signal $V_{2E}$ 620 of FIG. 6 is substantially equal to the difference between the reference signal 614 and the sensed signal 612 multiplied by the ratio between resistance R7 and R6 plus the reference signal 614, or mathematically:

$$V_{2E\_FIG6} = V_{REF} + (V_{REF} - V_{SENSED})\frac{R7}{R6}. \tag{17}$$

As shown in the depicted example, a summing amplifier 608 is coupled to receive the negative integrated error, $-V_{INT}$ 618, and the second error signal $V_{2E}$ 620. In the depicted example, summing amplifier 608 is configured to generate the control signal 622 of FIG. 6, which is substantially equal to the sum of the negative integrated error, $-V_{INT}$ 618, and the second error signal $V_{2E}$ 620, or mathematically:

$$V_{CONTROL\_FIG6} = -V_{INT} + V_{2E\_FIG6}. \tag{18}$$

Figure 7:
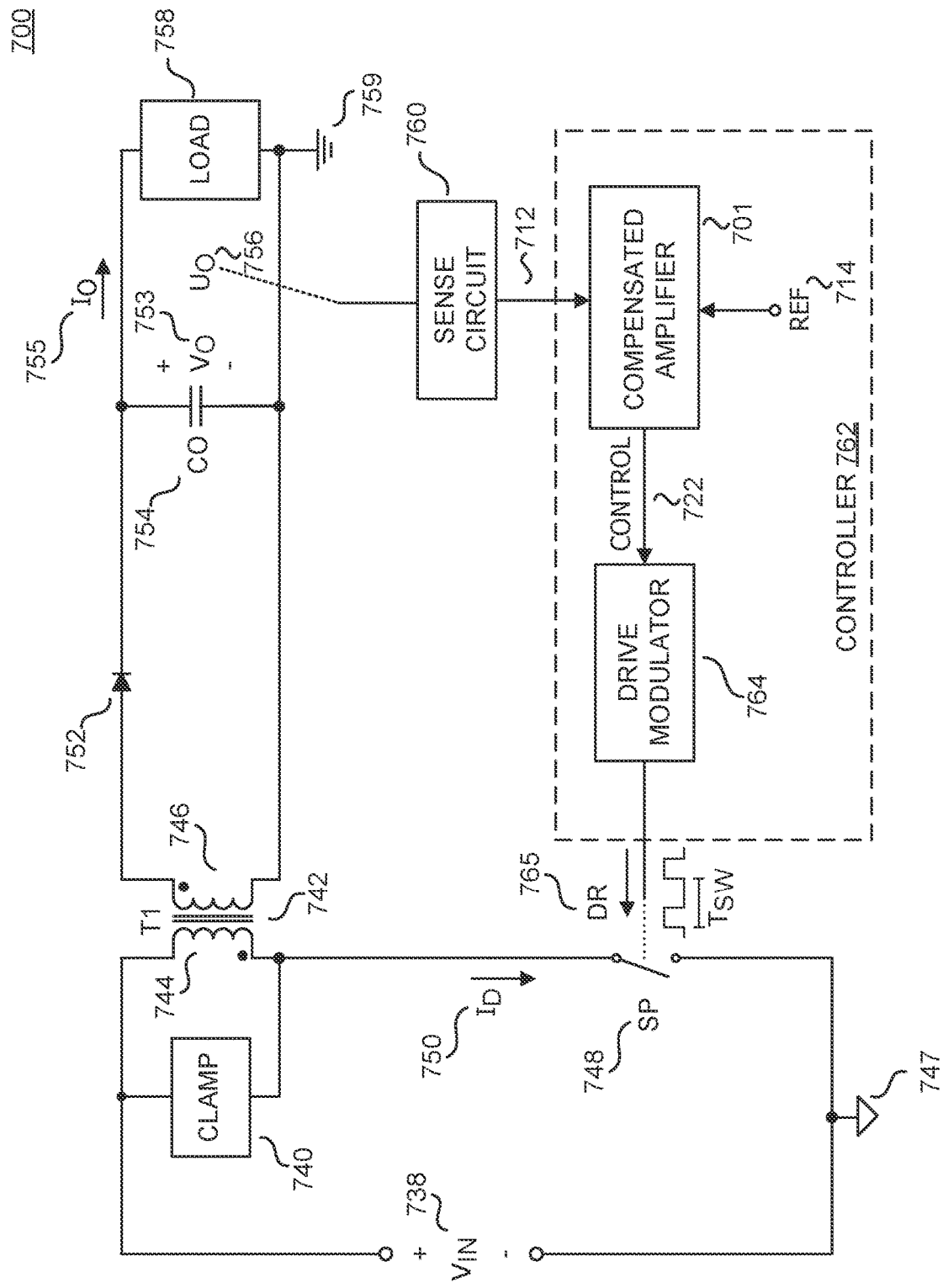
FIG. 7 illustrates an example of a switched mode power converter in a flyback configuration with a controller including an example compensated amplifier in accordance with the teachings of the present invention.

FIG. 7 illustrates an example of a switched mode power converter 700 in a flyback configuration with a controller 762 including an example compensated amplifier 701 in accordance with the teachings of the present invention. It is appreciated that any of the example compensated amplifiers 200, 201, 300, 400, 500, 600 discussed above in FIGS. 2A-6 may be utilized for compensated amplifier 701 of FIG. 7, and that similarly named and numbered elements described above are coupled and function similarly below.

As shown in the example depicted in FIG. 7, power converter 700 includes controller 762 including an example compensated amplifier 701 in accordance with an embodiment of the present disclosure. The illustrated power converter 700 further includes a clamp circuit 740, energy transfer element T1 742, an input winding 744 of the energy transfer element T1 742, an output winding 746 of the energy transfer element T1 742, a power switch SP 748, an input return 747, an output rectifier 752, an output capacitor CO 754, an output return 759, and an output sense circuit 760.

As shown the depicted example, controller 762 includes compensated amplifier 701, which is coupled to receive a reference signal REF 714 and a sensed signal 712 from the sense circuit 760. In the depicted example, the sensed signal 712 is a feedback signal representative of the output of the power converter 700. Compensated amplifier 701 is configured to generate a control signal 722 in response to the sensed signal 712 and the reference signal REF 714. A drive modulator 764 is coupled to generate a drive signal DR 765 to control switching of the power switch SP 748 in response to the control signal 722 received from compensated amplifier 701. Further shown in FIG. 7 are an input voltage $V_{IN}$ 738, a drain current $I_D$ 750, an output voltage $V_O$ 753, an output current $I_O$ 755, and an output quantity $U_O$ 756.

In the illustrated example, the power converter 700 is shown as having a flyback topology. Further, the input of power converter 700 is galvanically isolated from the output of the power converter 700, such that input return 747 is galvanically isolated from output return 759. Since the input and output of power converter 700 are galvanically isolated, there is no direct current (dc) path across the isolation barrier of energy transfer element T1 742, or between input winding 744 and output winding 746, or between input return 747 and output return 759. It is appreciated that other known topologies and configurations of power converters may also benefit from the teachings of the present disclosure.

In operation, the power converter 700 provides output power to a load 758 from an unregulated input voltage $V_{IN}$ 738. In one embodiment, the input voltage $V_{IN}$ 738 is a rectified and filtered ac line voltage. In another embodiment, the input voltage $V_{IN}$ 738 is a dc input voltage. The input voltage $V_{IN}$ 738 is coupled to the energy transfer element 742. In some examples, the energy transfer element 742 may be a coupled inductor, transformer, or an inductor. The energy transfer element 742 is shown as including two windings, input winding 744 (also referred to as a primary winding) and output winding 746 (also referred to as a secondary winding). However, in other examples the energy transfer element 742 may have three or more windings. As shown, the input winding 744 of the energy transfer element T1 742 is further coupled to the power switch SP 748 and the power switch SP 748 is further coupled to input return 747. Coupled across the input winding 744 is the clamp circuit 740. The clamp circuit 740 limits the maximum voltage on the power switch SP 748.

Output winding 746 is coupled to the output rectifier 752, which is exemplified as a diode in the depicted example. However, in another example, the output rectifier may be exemplified as a transistor used as a synchronous rectifier. Output capacitor CO 754 is shown as being coupled to the output rectifier 752 and the output return 759. The power converter 700 further includes circuitry to regulate the output quantity $U_O$ 756, which in one example may be the output voltage $V_O$ 753, output current $I_O$ 755, or a combination of the two. The output sense circuit 760 is configured to sense the output quantity $U_O$ 756 to provide the sensed signal 712, which is representative of the output of the power converter 700, to the compensated amplifier 701 of controller 762 as shown. As discussed in the various examples above, compensated amplifier 701 is configured to generate the control signal 722 in response to the sensed signal 712 and the reference signal REF 714.

In one example, the controller 762 may be formed as part of an integrated circuit that is manufactured as either a hybrid or monolithic integrated circuit. In one example, the power switch SP 748 may also be integrated in a single integrated circuit package with the controller 762. Further, it should be appreciated that both the controller 762 and power switch SP 748 need not be included in a single package and may be implemented in separate packages or a combination of combined/separate packages. It should be appreciated that the controller 762 may include a primary-side controller referenced to input return 747 and a secondary-side controller referenced to output return 759 with galvanic isolation between the primary-side controller and secondary-side controller.

In one example, the power switch SP 748 may be a transistor such as a metal-oxide-semiconductor field-effect transistor (MOSFET), a bipolar junction transistor (BJT), an insulated-gate bipolar transistor (IGBT a gallium nitride (GaN) based transistor, or a silicon carbide (SiC) based transistor. In another example the power switch may be a is a cascode switch including a normally-on first switch and a normally-off second switch coupled together in a cascode configuration. The first switch may generally be a GaN or SiC based transistor while the second switch may be a MOSFET, BJT, or IGBT.

In one example, the controller 762 may be coupled to receive a current sense signal representative of the drain current $I_D$ 750 of the power switch SP 748 in addition to the sensed signal 712 to generate the drive signal DR 765. In various examples, the drive modulator 764 of controller 762 is configured to generate the drive signal DR 765 to the power switch SP 748 in response to the control signal 722 to control various switching parameters of the power switch SP 748 to control the transfer of energy from the input of the power converter 700 to the output of the power converter 700 through the energy transfer element 742. Example of such parameters include switching frequency (or switching period), duty cycle, on-times, off-times, or varying the number of pulses per unit time of the power switch SP 748. In addition, the power switch SP 748 may be controlled by driver modulator 764 such that the drive signal DR 765 has a fixed switching frequency or a variable switching frequency.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1. A compensated amplifier for use in a power converter controller, comprising a first amplifier coupled to receive a sensed signal and a reference signal and configured to generate a first error signal in response to the sensed signal and the reference signal; a second amplifier coupled to the first amplifier and configured to generate a second error signal in response to the sensed signal and the reference signal; an integrator coupled to the first amplifier and configured to generate an integrated error signal in response to the first error signal; and an arithmetic operator coupled to the integrator and to the second amplifier, wherein the arithmetic operator is configured to generate a control signal in response to the integrated error signal and the second error signal.

Example 2. The compensated amplifier of example 1, wherein an input of the first amplifier and an input of the second amplifier are coupled together to receive the sensed signal and the reference signal to generate the first error signal and the second error signal, respectively, in response to the sensed signal and the reference signal.

Example 3. The compensated amplifier of example 1 or 2, wherein an input of the first amplifier is coupled to receive the sensed signal and the reference signal to generate the first error signal in response to the sensed signal and the reference signal and the second amplifier is coupled to an output of the first amplifier to generate the second error signal in response to the sensed signal and the reference signal.

Example 4. The compensated amplifier of example 1 to 3, wherein the first amplifier comprises a first transconductance amplifier.

Example 5. The compensated amplifier of example 1 to 4, wherein the second amplifier comprises a differential amplifier, wherein the integrator comprises a capacitor coupled between an output of the first amplifier and an output of the second amplifier, and wherein the compensated amplifier further comprises a resistor coupled between the output of the first amplifier and a return.

Example 6. The compensated amplifier of example 1 to 5, wherein the second amplifier comprises a second transconductance amplifier, wherein the integrator comprises a capacitor coupled between an output of the first amplifier and a return, and wherein the compensated amplifier further comprises a first resistor coupled between the output of the first amplifier and the return.

Example 7. The compensated amplifier of example 1 to 6, wherein the compensated amplifier further comprises a third amplifier having an input coupled to the capacitor and an output coupled to the arithmetic operator, wherein the third amplifier comprises a third transconductance amplifier; and a second resistor coupled between the output of the third amplifier and the return.

Example 8. The compensated amplifier of example 1 to 7, wherein the compensated amplifier includes an operational amplifier integrator having a first input coupled to receive the sensed signal, a second input coupled to receive the reference signal, and an output configured to provide the integrated error signal.

Example 9. The compensated amplifier of example 1 to 8, wherein the operational amplifier integrator comprises the first amplifier, wherein the first amplifier comprises a first operational amplifier having the first input coupled to receive sensed signal through a first resistor, and the second input coupled to receive the reference signal, wherein an output of the first operational amplifier is coupled to the output of the operational amplifier integrator; and the integrator, wherein the integrator comprises a capacitor coupled between the output of the first operational amplifier and the first input of the first operational amplifier.

Example 10. The compensated amplifier of example 1 to 9, wherein the second amplifier comprises a transconductance amplifier, wherein compensated amplifier further comprises a second resistor coupled between the output of the first operational amplifier and an output of the transconductance amplifier, and wherein the control signal is taken from a node between the second resistor and the output of the transconductance amplifier.

Example 11. The compensated amplifier of example 1 to 10, wherein the second amplifier comprises a second operational amplifier, wherein the second operational amplifier incudes a first input coupled to receive the sensed signal, wherein the second operational amplifier incudes a second input coupled to receive the reference signal, and wherein an output of the second operational amplifier is coupled to the first input of the second operational amplifier.

Example 12. The compensated amplifier of example 1 to 11, wherein the arithmetic operator comprises a summing amplifier having a first input coupled to the output of the first operational amplifier, wherein the summing amplifier has a second input coupled to the output of the second operational amplifier, and wherein the summing amplifier has an output coupled to generate the control signal.

Example 13. A controller for use in a power converter, comprising:

a driver modulator configured to generate a drive signal in response to a control signal to control switching of a power switch of the power converter to regulate transfer of energy from an input of the power converter to an output of the power converter; and a compensated amplifier configured to generate the control signal in response to a reference signal and a sensed signal representative of the output of the power converter, wherein the compensated amplifier comprises a first amplifier coupled to receive the sensed signal and the reference signal and configured to generate a first error signal in response to the sensed signal and the reference signal; a second amplifier coupled to the first amplifier and configured to generate a second error signal in response to the sensed signal and the reference signal; an integrator coupled to the first amplifier and configured to generate an integrated error signal in response to the first error signal; and an arithmetic operator coupled to the integrator and the second amplifier and configured to generate a control signal in response to the integrated error signal and the second error signal.

Example 14. The controller of example 13, wherein an input of the first amplifier and an input of the second amplifier are coupled together to receive the sensed signal and the reference signal to generate the first error signal and the second error signal, respectively, in response to the sensed signal and the reference signal.

Example 15. The controller of example 13 or 14, wherein an input of the first amplifier is coupled to receive the sensed signal and the reference signal to generate the first error signal in response to the sensed signal and the reference signal, and wherein an input of the second amplifier is coupled to an output of the first amplifier to generate the second error signal in response to the sensed signal and the reference signal.

Example 16. The controller of example 13 to 15, wherein the first amplifier comprises a first transconductance amplifier.

Example 17. The controller of example 13 to 16, wherein the second amplifier comprises a differential amplifier, wherein the integrator comprises a capacitor coupled between an output of the first amplifier and an output of the second amplifier, wherein the compensated amplifier further comprises a resistor coupled between the output of the first amplifier and a return.

Example 18. The controller of example 13 to 17, wherein the second amplifier comprises a second transconductance amplifier, wherein the integrator comprises a capacitor coupled between an output of the first amplifier and a return, and wherein the compensated amplifier further comprises a first resistor coupled between the output of the first amplifier and the return.

Example 19. The controller of example 13 to 18, wherein the compensated amplifier further comprises: a third amplifier having an input coupled to the capacitor and an output coupled to the arithmetic operator, wherein the third amplifier comprises a third transconductance amplifier; and a second resistor coupled between the output of the third amplifier and the return.

Example 20. The controller of example 13 to 19, wherein the compensated amplifier includes an operational amplifier integrator having a first input coupled to receive the sensed signal, a second input coupled to receive the reference signal, and an output configured to generate the integrated error signal.

Example 21. The controller of example 13 to 20, wherein the operational amplifier integrator comprises: the first amplifier, wherein the first amplifier comprises a first operational amplifier having the first input coupled to receive sensed signal through a first resistor, and having the second input coupled to receive the reference signal, wherein an output of the first operational amplifier is coupled to the output of the operational amplifier integrator; and the integrator, wherein the integrator comprises a capacitor coupled between the output of the first operational amplifier and the first input of the first operational amplifier.

Example 22. The controller of example 13 to 21, wherein the second amplifier comprises a transconductance amplifier, wherein compensated amplifier further comprises a second resistor coupled between the output of the first operational amplifier and an output of the transconductance amplifier, wherein the control signal is taken from a node between the second resistor and the output of the transconductance amplifier.

Example 23. The controller of example 13 to 22, wherein the second amplifier comprises a second operational amplifier, wherein the second operational amplifier incudes a first input coupled to receive the sensed signal, wherein the second operational amplifier incudes a second input coupled to receive the reference signal, and wherein an output of the second operational amplifier is coupled to the first input of the second operational amplifier.

Example 24. The controller of example 13 to 23, wherein the arithmetic operator comprises a summing amplifier having a first input coupled to the output of the first operational amplifier, wherein the summing amplifier has a second input coupled the output of the second operational amplifier, wherein the summing amplifier has an output coupled to generate the control signal.

What is claimed is:

1. A compensated amplifier for use in a power converter controller, comprising:
   a first amplifier coupled to receive a sensed signal and a reference signal and configured to generate a first error signal in response to the sensed signal and the reference signal;
   a second amplifier coupled to the first amplifier and configured to generate a second error signal in response to the sensed signal and the reference signal;
   an integrator coupled to the first amplifier and configured to generate an integrated error signal in response to the first error signal; and
   an arithmetic operator coupled to the second amplifier, wherein the arithmetic operator is configured to generate a control signal in response to the integrated error signal and the second error signal,
   wherein the first amplifier comprises a first transconductance amplifier, and
   wherein the second amplifier comprises a differential amplifier, wherein the integrator comprises a capacitor coupled between an output of the first amplifier and an output of the second amplifier, and wherein the compensated amplifier further comprises a resistor coupled between the output of the first amplifier and a return.

2. The compensated amplifier for use in a power converter controller, comprising:
   a first amplifier coupled to receive a sensed signal and a reference signal and configured to generate a first error signal in response to the sensed signal and the reference signal;
   a second amplifier coupled to the first amplifier and configured to generate a second error signal in response to the first error signal from the first amplifier;
   an integrator coupled to the first amplifier and configured to generate an integrated error signal in response to the first error signal; and
   an arithmetic operator coupled to the second amplifier, wherein the arithmetic operator is configured to generate a control signal in response to the integrated error signal and the second error signal,
   wherein an input of the second amplifier is coupled to receive the first error signal of the first amplifier to generate the second error signal.

3. A compensated amplifier for use in a power converter controller, comprising:
   a first amplifier coupled to receive a sensed signal and a reference signal and configured to generate a first error signal in response to the sensed signal and the reference signal;
   a second amplifier coupled to the first amplifier and configured to generate a second error signal in response to the sensed signal and the reference signal;
   an integrator coupled to the first amplifier and configured to generate an integrated error signal in reesponse to the first error signal; and
   an arithmetic operator coupled to the second amplifier, wherein the arithmetic operator is configured to generate a control signal in response to the integrated error signal and the second error signal,
   wherein the first amplifier comprises a first transconductance amplifier, and
   wherein the seond amplifier comprises a second transconductance amplifier, wherein the integrator comprises a capacitor coupled between an output of the first amplifier and a return, and wherein the compensated amplifier further comprises a first resistor coupled between the output of the first amplifier and the return.

4. The compensated amplifier of claim 3, wherein the compensated amplifier further comprises:
   a third amplifier having an input coupled to the capacitor and an output coupled to the arithmetic operator, wherein the third amplifier comprises a third transconductance amplifier; and
   a second resistor coupled between the output of the third amplifier and the return.

5. The compensated amplifier for use in a power converter controller, comprising:
   a first amplifier coupled to receive a sensed signal and a refeerence signal and configured to generatre a first error signal in response to the sensed signal and the reference signal;
   a second amplifier coupled to the first amplifier and configured to generate a second error signal in response to the sensed signal and the reference signal;
   an integrator coupled to the first amplifier and configured to generate an integrated error signal in response to the first error signal; and
   an arithmetic operator coupled to the second amplifier, wherein the arithmetic operator is configured to generate a control signal in response to the integrated error signal and the second error signal,
   wherein the first amplifier is a first operational amplifier having a first input coupled to receive the sensed signal through a first resistor, and a second input coupled to receive the reference signal; and
   wherein the integrator comprises a capacitor coupled between the output of the first operational amplifier and the first input of the first operational amplifier.

6. The compensated amplifier of claim 5, wherein the second amplifier comprises a transconductance amplifier, wherein compensated amplifier further comprises a second resistor coupled between the output of the first operational amplifier and an output of the transconductance amplifier, and wherein the control signal is taken from a node between the second resistor and the output of the transconductance amplifier.

7. The compensated amplifier of claim 5, wherein the second amplifier is a second operational amplifier, wherein the second operational amplifier incudes a first input coupled to receive the sensed signal, wherein the second operational amplifier incudes a second input coupled to receive the reference signal, and wherein an output of the second operational amplifier is coupled to the first input of the second operational amplifier.

8. The compensated amplifier of claim 7, wherein the arithmetic operator comprises a summing amplifier having a first input coupled to the output of the first operational amplifier, wherein the summing amplifier has a second input coupled to the output of the second operational amplifier, and wherein the summing amplifier has an output coupled to generate the control signal.

9. A controller for use in a power converter, comprising:
   a driver modulator configured to generate a drive signal in response to a control signal to control switching of a power switch of the power converter to regulate transfer of energy from an input of the power converter to an output of the power converter; and
   a compensated amplifier configured to generate the control signal in response to a reference signal and a sensed signal representative of the output of the power converter, wherein the compensated amplifier comprises:
   a first amplifier coupled to receive the sensed signal and the reference signal and configured to generate a first error signal in response to the sensed signal and the reference signal;
   a second amplifier coupled to the first amplifier and configured to generate a second error signal in response to the sensed signal and the reference signal;
   an integrator coupled to the first amplifier and configured to generate an integrated error signal in response to the first error signal; and
   an arithmetic operator coupled to the second amplifier and configured to generate a control signal in response to the integrated error signal and the second error signal.

10. The controller of claim 9, wherein an input of the first amplifier and an input of the second amplifier are coupled together to receive the sensed signal and the reference signal to generate the first error signal and the second error signal, respectively, in response to the sensed signal and the reference signal.

11. The controller of claim 10, wherein the first amplifier comprises a first transconductance amplifier.

12. The controller of claim 11, wherein the second amplifier comprises a differential amplifier, wherein the integrator comprises a capacitor coupled between an output of the first amplifier and an output of the second amplifier, wherein the compensated amplifier further comprises a resistor coupled between the output of the first amplifier and a return.

13. The controller of claim 11, wherein the second amplifier comprises a second transconductance amplifier, wherein the integrator comprises a capacitor coupled between an output of the first amplifier and a return, and wherein the compensated amplifier further comprises a first resistor coupled between the output of the first amplifier and the return.

14. The controller of claim 13, wherein the compensated amplifier further comprises:
   a third amplifier having an input coupled to the capacitor and an output coupled to the arithmetic operator, wherein the third amplifier comprises a third transconductance amplifier; and
   a second resistor coupled between the output of the third amplifier and the return.

15. The controller of claim 10, wherein the first amplifier and the integrator are coupled as an operational amplifier integrator having a first input coupled to receive the sensed signal, a second input coupled to receive the reference signal, and an output configured to generate the integrated error signal.

16. The controller of claim 15,
   wherein the first amplifier is a first operational amplifier having the first input coupled to receive sensed signal through a first resistor, and having the second input coupled to receive the reference signal, wherein an output of the first operational amplifier is coupled to the output of the operational amplifier integrator; and
   wherein the integrator comprises a capacitor coupled between the output of the first operational amplifier and the first input of the first operational amplifier.

17. The controller of claim 16, wherein the second amplifier comprises a transconductance amplifier, wherein compensated amplifier further comprises a second resistor coupled between the output of the first operational amplifier and an output of the transconductance amplifier, wherein the control signal is taken from a node between the second resistor and the output of the transconductance amplifier.

18. The controller of claim 16, wherein the second amplifier is a second operational amplifier, wherein the second operational amplifier incudes a first input coupled to receive the sensed signal, wherein the second operational amplifier incudes a second input coupled to receive the reference signal, and wherein an output of the second operational amplifier is coupled to the first input of the second operational amplifier.

19. The controller of claim 18, wherein the arithmetic operator comprises a summing amplifier having a first input coupled to the output of the first operational amplifier, wherein the summing amplifier has a second input coupled the output of the second operational amplifier, wherein the summing amplifier has an output coupled to generate the control signal.

20. A controller for use in a power converter, comprising:
   a driver modulator configured to generate a drive signal in response to a control signal to control switching of a power switch of the power converter to regulate transfer of energy from an input of the power converter to an output of the power converter; and
   a compensated amplifier configured to generate the control signal in response to a reference signal and a sensed signal representative of the output of the power converter, wherein the compensated amplifier comprises:
   a first amplifier coupled to receive the sensed signal and the reference signal and configured to generate a first error signal in response to the sensed signal and the reference signal;
   a second mplifier coupled to the first amplifier and configured to generate a second error signal;
   an integrator coupled to the first amplifier and configured to generate an integrated error signal in response to the first error signal; and
   an arithmetic operator coupled to the integrator and the second amplifier and configured to generate a control signal in response to the integrated error signal and the second error signal, wherein an input of the first amplifier is coupled to receive the sensed signal and the reference signal to generate the first error signal in response to the sensed signal and the reference signal, and wherein an input of the second amplifier is coupled to an output of the first amplifier to generate the second error signal in response to the first error signal.

21. A compensated amplifier for use in a power converter controller, comprising:
- a first amplifier coupled to receive a sensed signal and a reference signal and configured to generate a first error signal in response to the sensed signal and the reference signal;
- a second amplifier coupled to the first amplifier and configured to generate a second error signal in response to the sensed signal and the reference signal;
- an integrator coupled to the first amplifier and configured to generate an integrated error signal in response to the first error signal; and
- an arithmetic operator coupled to the second amplifier, wherein the arithmetic operator is configured to generate a control signal in response to the integrated error signal and the second error signal, and
- wherein the second amplifier comprises a differential amplifier, wherein the integrator comprises a capacitor coupled between an output of the first amplifier and an output of the second amplifier, and wherein the compensated amplifier further comprises a resistor coupled between the output of the first amplifier and a return.

\* \* \* \* \*

UNITED STATES PATENT AND TRADEMARK OFFICE
CERTIFICATE OF CORRECTION

PATENT NO. : 11,942,900 B2
APPLICATION NO. : 17/501877
DATED : March 26, 2024
INVENTOR(S) : A. Odell It is certified that error appears in the above-identified patent and that said Letters Patent is hereby corrected as shown below:

In the Claims

| Column | Line | |
|--------|------|---|
| 21 | 59 | change "The compensated" to -- A compensated -- |
| 22 | 21 | change "in reesponse" to -- in response -- |
| 22 | 43 | change "The compensated" to -- A compensated -- |
| 24 | 15 | change "receive sensed" to -- receive the sensed -- |
| 24 | 24-25 | change "wherein compensated" to -- wherein the compensated -- |
| 24 | 41-42 | change "coupled the" to -- coupled to the -- |

Signed and Sealed this
Third Day of December, 2024

Katherine Kelly Vidal
*Director of the United States Patent and Trademark Office*